(12) United States Patent
Lee et al.

(10) Patent No.: US 9,722,556 B1
(45) Date of Patent: Aug. 1, 2017

(54) RF TRANSFORMER FOR DIFFERENTIAL AMPLIFIER

(71) Applicant: SOONGSIL UNIVERSITY RESEARCH CONSORTIUM TECHNO-PARK, Seoul (KR)

(72) Inventors: Mi Lim Lee, Gyeonggi-do (KR); Chang Kun Park, Gyeonggi-do (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 0 days.

(21) Appl. No.: 15/139,327

(22) Filed: Apr. 27, 2016

(30) Foreign Application Priority Data

Jan. 28, 2016 (KR) ........................ 10-2016-0010704

(51) Int. Cl.
*H03F 3/45* (2006.01)
*H03F 1/56* (2006.01)
*H03F 3/195* (2006.01)
*H01L 23/66* (2006.01)
*H01L 25/065* (2006.01)
*H01L 23/538* (2006.01)

(52) U.S. Cl.
CPC ..... *H03F 3/45269* (2013.01); *H01L 23/5384* (2013.01); *H01L 23/66* (2013.01); *H01L 25/0657* (2013.01); *H03F 1/565* (2013.01); *H03F 3/195* (2013.01); *H01L 2223/6638* (2013.01); *H03F 2200/451* (2013.01); *H03F 2200/534* (2013.01); *H03F 2200/541* (2013.01)

(58) Field of Classification Search
CPC ....................................................... H03F 3/45

USPC ...................................... 330/253, 165, 307
See application file for complete search history.

(56) References Cited

U.S. PATENT DOCUMENTS

| | | | | |
|---|---|---|---|---|
| 8,486,744 | B2* | 7/2013 | Lin | B81C 1/00269 |
| | | | | 174/150 |
| 8,610,247 | B2* | 12/2013 | Yen | H01L 23/5227 |
| | | | | 257/531 |
| 8,647,962 | B2* | 2/2014 | Liu | B81C 1/00269 |
| | | | | 438/406 |
| 9,515,676 | B2* | 12/2016 | Sugnet | H03M 7/30 |
| 2009/0009558 | A1* | 1/2009 | Silverbrook | B41J 2/1412 |
| | | | | 347/47 |
| 2009/0218668 | A1* | 9/2009 | Zhe | B81C 1/00301 |
| | | | | 257/680 |
| 2011/0062330 | A1* | 3/2011 | Ben-Bassat | G01J 5/08 |
| | | | | 250/330 |

(Continued)

FOREIGN PATENT DOCUMENTS

KR 10-0743951 B1 8/2007

*Primary Examiner* — Henry Choe
(74) *Attorney, Agent, or Firm* — Revolution IP, PLLC

(57) ABSTRACT

The present invention relates to a high frequency transformer for a differential amplifier. An exemplary embodiment of the present invention provides a high frequency transformer for a differential amplifier, including: a first metal line that is integrated and formed in an IC chip through a CMOS process and that is connected to a differential signal line of a transistor included in the IC chip; and a second metal line that is formed in an MEMS chip through an MEMS process and that is inductively coupled with the first metal line in a state spaced apart from an upper portion of the first metal line, wherein the MEMS chip may be stacked on an upper portion of the IC chip.

12 Claims, 6 Drawing Sheets

(56) References Cited

U.S. PATENT DOCUMENTS

2015/0349726 A1* 12/2015 Han .................... H03F 1/42
330/250

* cited by examiner

【FIG. 1】
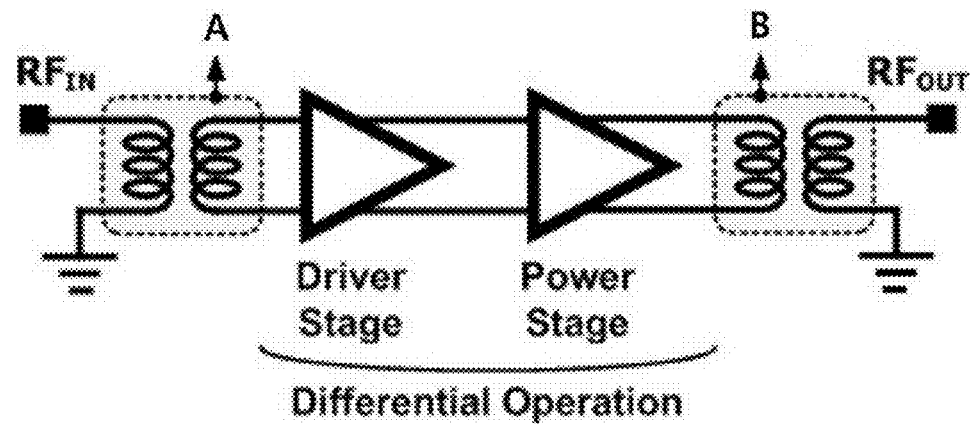
【FIG. 2】
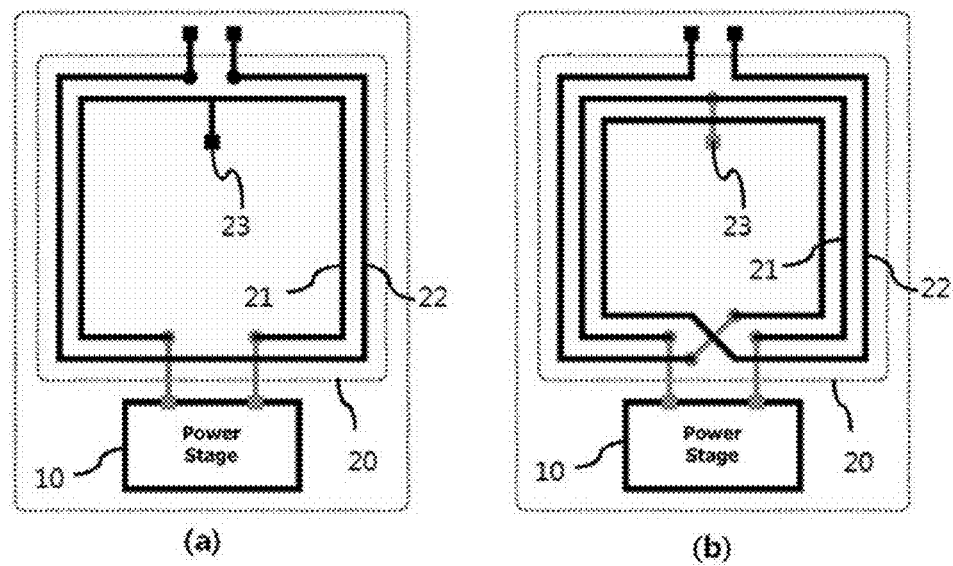

【FIG. 3】
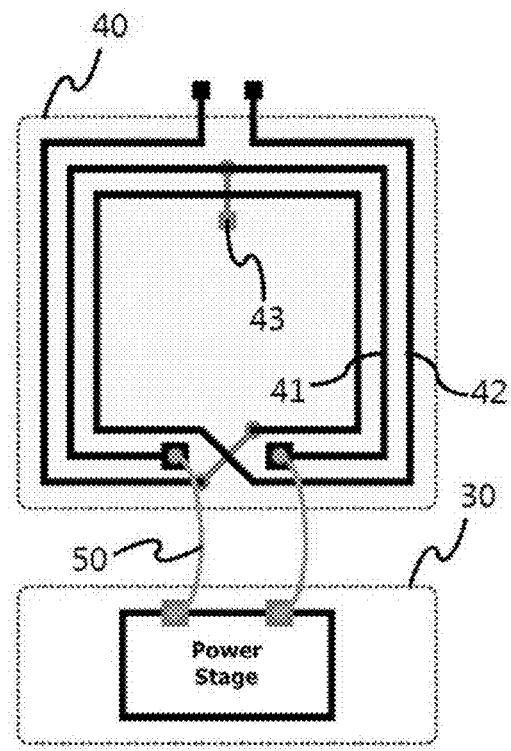
【FIG. 4】
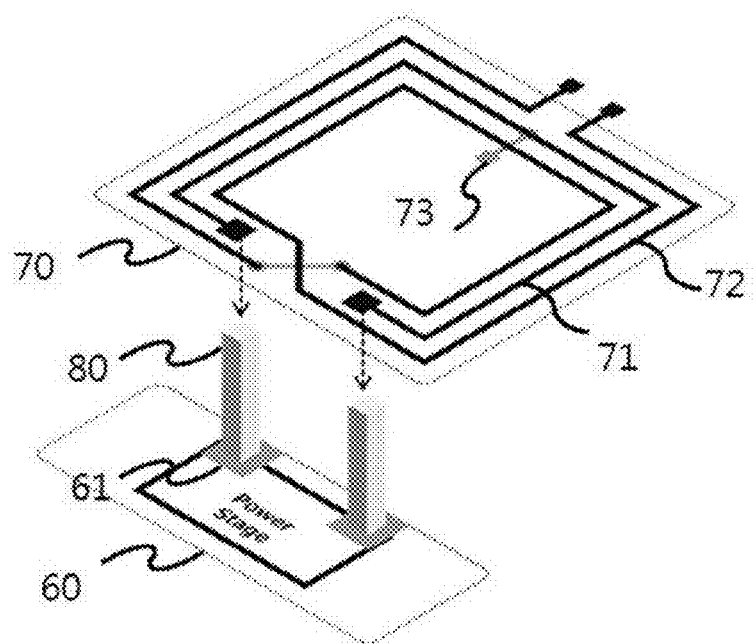

[FIG. 5]
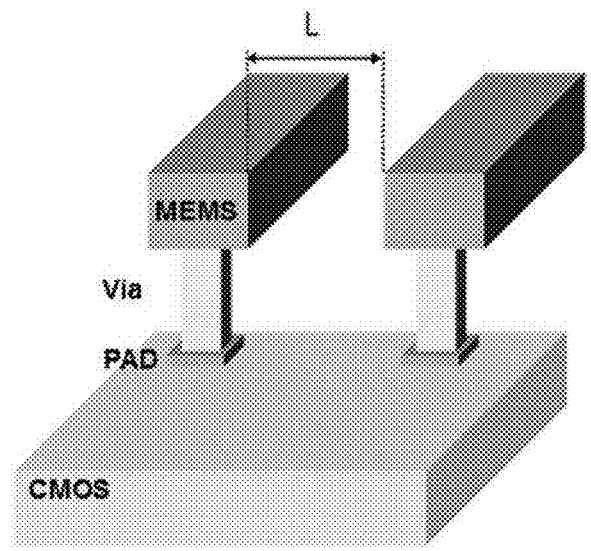
[FIG. 6]
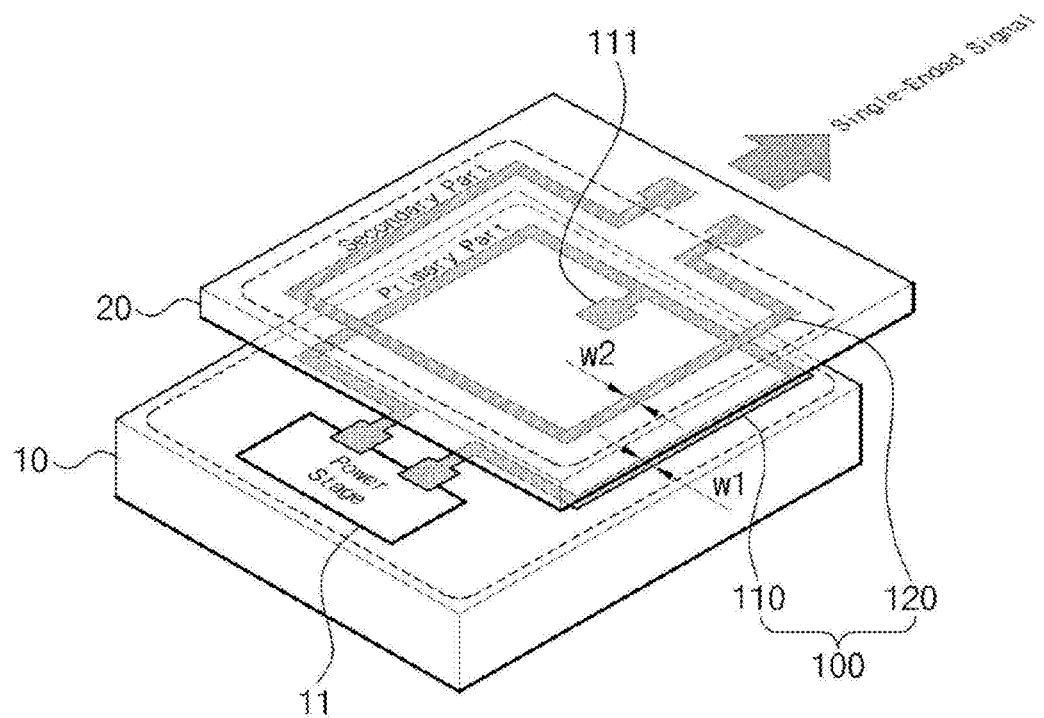

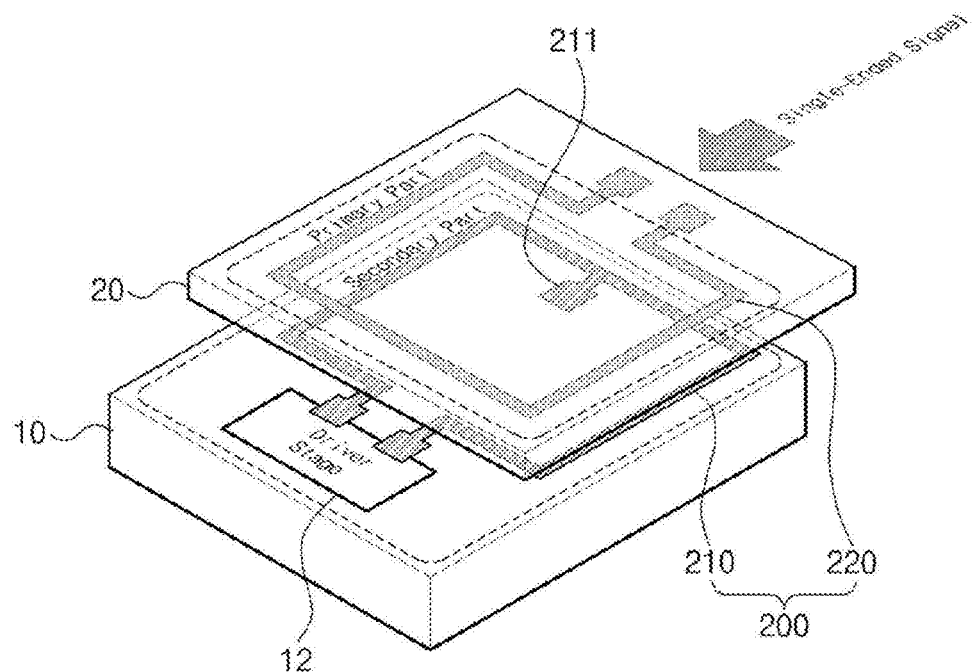
[FIG. 7]
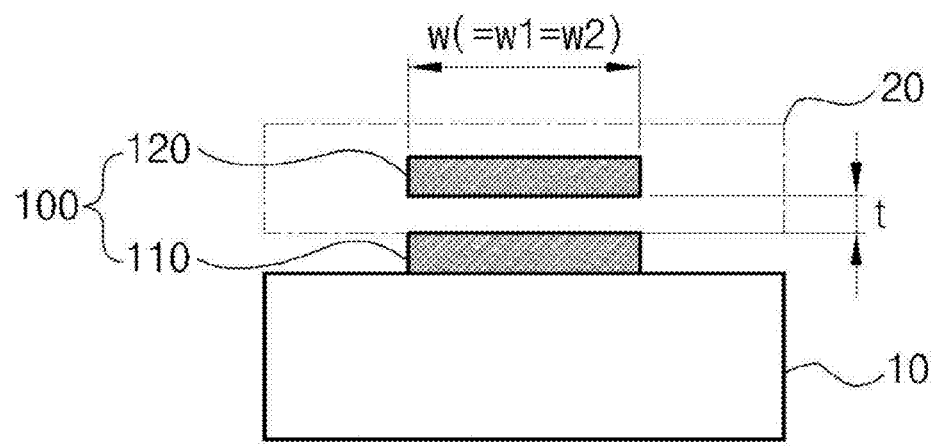
[FIG. 8]

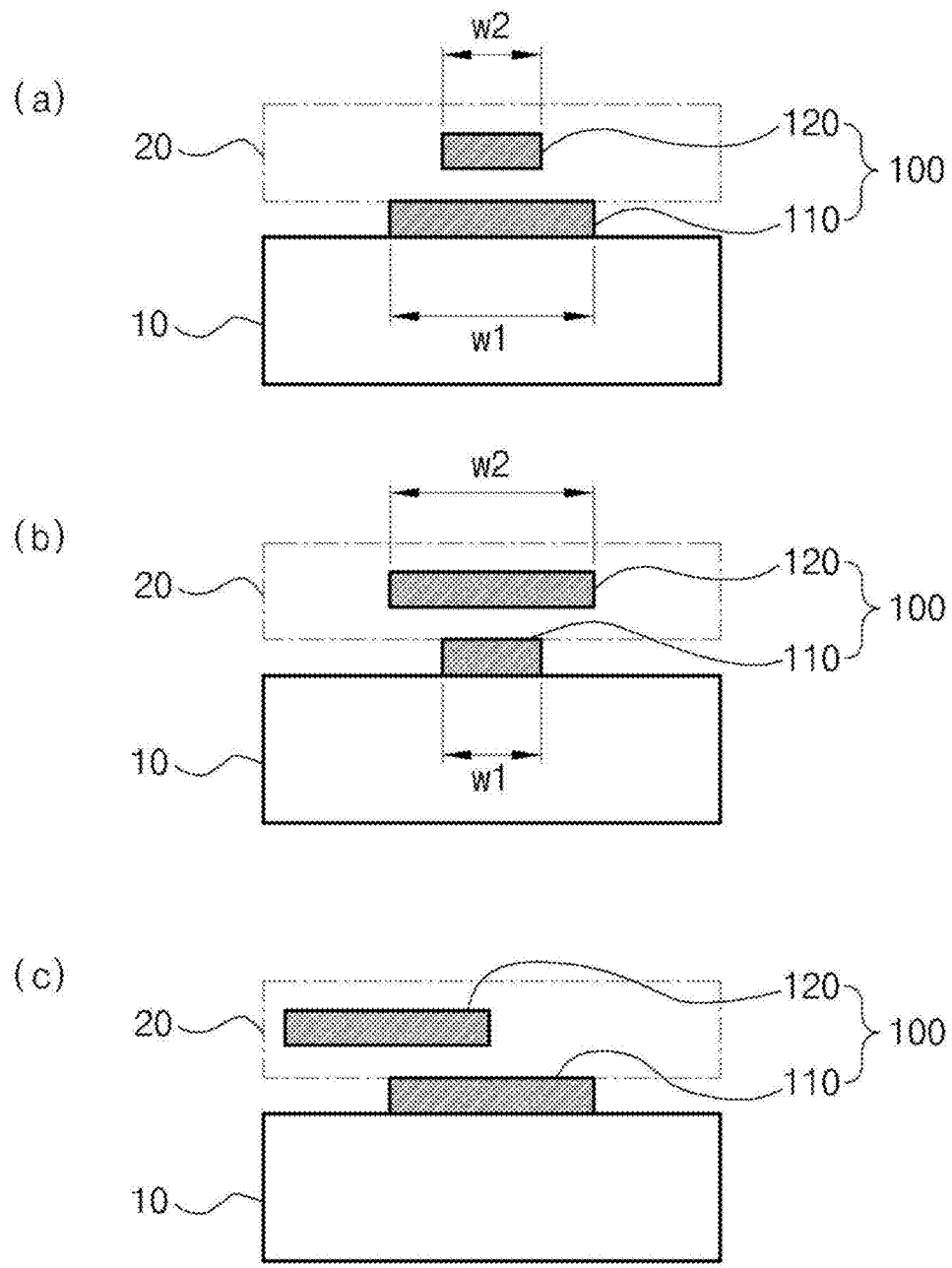

[FIG. 10]
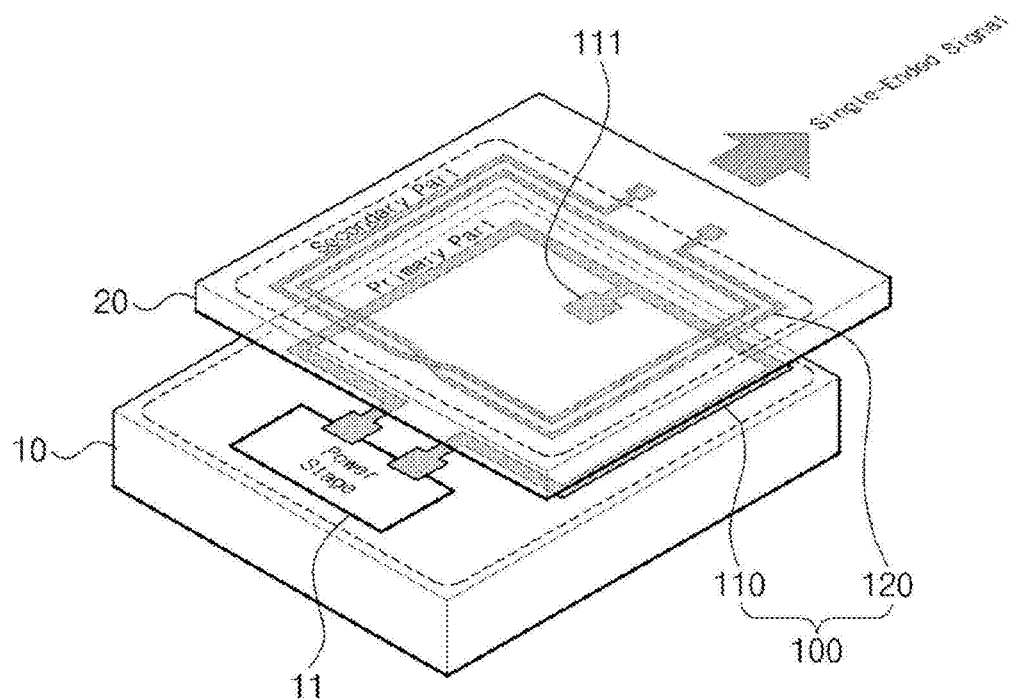
[FIG. 11]
(a)
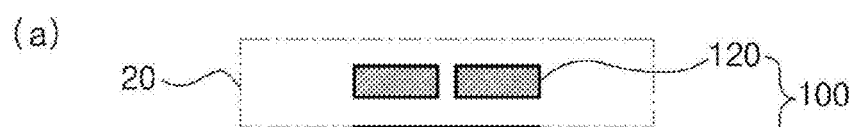
(b)
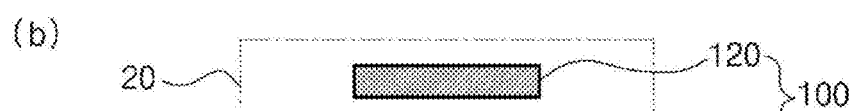

RF TRANSFORMER FOR DIFFERENTIAL AMPLIFIER

CROSS-REFERENCE TO RELATED APPLICATION

This application claims priority to and the benefit of Korean Patent Application No. 10-2016-0010704 filed in the Korean Intellectual Property Office on Jan. 28, 2016, the entire contents of which are incorporated herein by reference.

BACKGROUND OF THE INVENTION (a) Field of the Invention

The present invention relates to a high frequency transformer for a differential amplifier, and more particularly, to a high frequency transformer for a differential amplifier that may improve power conversion efficiency and output power of an amplifier.

(b) Description of the Related Art

FIG. 1 is a schematic diagram for explaining an amplifier of a differential structure formed in an integrated circuit. Referring to FIG. 1, the amplifier of the differential structure includes an input-sided transformer A, a driver stage, a power stage, and an output-sided transformer B.

In FIG. 1, the input-sided transformer A receives a single-ended signal ($RF_{IN}$) and then converts it into a differential signal. The driver stage amplifies the differential signal to generate power by which that the power stage may operate, and the power stage amplifies a signal received from the driver stage to be greater. The output-sided transformer B combines a differential signal received from the power stage to convert it into a single-ended signal ($RF_{OUT}$) again.

Generally, although a corresponding amplifier is an amplifier of a differential structure, since input and output signals of the amplifier according to an internal operation thereof are mainly single-ended signals, the input-sided transformer A for converting a single-ended signal inputted to the amplifier into a differential signal and the output-sided transformer B for converting a differential signal outputted from the amplifier into a single-ended signal are necessarily used.

The input-sided and output-sided transformers serve to perform the conversion between the single-ended signal and the differential signal, and they also serve as a matching circuit between an input part and an output part thereof depending on a parasitic inductance, a predetermined winding ratio, etc. Particularly, the winding ratio and the parasitic inductance of the output-sided transformer B importantly serves to form an output matching part, which directly affects the power conversion efficiency, the maximum output power, etc. of the entire amplifier. Therefore, a distance, an entire size, a width, a predetermined winding ratio, etc. between metal lines of primary and secondary parts of the output-sided transformer B are determined by considering performance of the amplifier such as a target output power and a target power conversion efficiency thereof.

FIG. 2 is a schematic diagram for explaining a shape of an output-sided transformer shown in FIG. 1. FIG. 2 illustrates a state in which a primary part 21 of an output-sided transformer 20 is connected to a differential signal line of an output terminal of a power stage 10.

FIG. 2(a) illustrates a case in which a winding ratio of the primary part 21 and the secondary part 22 of the output-sided transformer 20 is 1:1, and FIG. 2(b) illustrates a case in which a winding ratio of the primary part 21 and the secondary part 22 is 1:2. A virtual ground 23 is formed at primary part 21 by the differential signal, and a power source voltage of the amplifier is supplied through the virtual ground 23. Accordingly, although only an AC current or an RF current exists in the secondary part 22 of the output-sided transformer 20, a DC current as well as an AC current or an RF current exist in the primary part 21 thereof.

The transformer illustrated in FIG. 1 and FIG. 2 is an example in which the transformer is integrated together with an amplifying stage in an integrated circuit. In the case of a typical CMOS process, excessive process costs are required to increase a thickness of the metal line in the integrated circuit. Accordingly, as shown in FIG. 1 and FIG. 2, when the transformer is integrated in the CMOS process, the thickness of the metal line for forming the transformer ranges from about 0.5 μm to about 2.0 μm. The thickness of the metal line does not become a problem in the case of using a low power, but a power leaked from the transformer indispensably increases in the case of using a high power of about 0.1 Watt or more, thereby reducing power conversion efficiency. In addition, the maximum output power of the amplifier may decrease due to power loss of the output-sided transformer, and a power gain of the amplifier may decrease due to power loss of the input-sided transformer.

In order to solve the problems, the Related Art forms the transformer through an integrated passive device (IPD) process rather than the CMOS process. A device manufactured by such an IPD process is classified into an integrated circuit chip as in the case of the CMOS. However, unlike the CMOS process, the IPD process does not include a process for a transistors or a diode, but includes only a process forming a passive device such as a resistor, inductor, and capacitor.

A metal line formed by the IPD process may be much thicker than that formed through the CMOS process in low manufacturing costs, thus it may reduce ohmic loss of a transformer more than when formed through the CMOS process. Further, in the case of a typical CMOS process, an AC or RF signal flowing through the metal line is attenuated in a lossy substrate, while the IPD may easily reduce loss in the substrate. Accordingly, when a transformer is formed by the IPD, a total power loss may be reduced.

FIG. 3 is a schematic view for connecting an amplifying stage formed by a CMOS process to a transformer formed by an IPD process. FIG. 3 illustrates a schematic diagram in which a primary part 41 of an output-sided transformer 40 is connected to an output side of a power stage 30, wherein a winding ratio of the primary and secondary parts 41 and 42 of the transformer 40 is about 1:2.

When the transformer 40 is formed through the IPD process, a manufacturing process of connecting the transformer 40 formed through the IPD process and the amplifying stage 30 formed through the CMOS process to each other is additionally required in order to design one amplifier. In this case, a circuit connection between the CMOS and IPD processes is generally performed by using a bonding wire 50.

However, since a manufacturing error of the bonding-wire is relatively large unlike the integrated circuit process, it is difficult to apply the bonding-wire to an amplifier having a high frequency bandwidth. In addition, power loss occurs due to the bonding wire, and it is impossible to manufacture two bonding wire to have the exactly same shape and parasitic inductance. Accordingly, considering power leak due to asymmetry between the bonding wires, the effect according to the IPD process is reduced. Further, although it is possible that the transformer and the amplifying stage are formed in one integrated circuit through the CMOS process in FIG. 2, in the case of FIG. 3, after separately forming two integrated circuits, since they are connected to each other, a size of the entire circuit may be additionally increased.

According to another related art for overcoming such a problem, an input-sided or output-sided transformer is formed through a micro electro mechanical system (MEMS) process. FIG. 4 illustrates a schematic diagram in which a transformer formed through the MEMS process is connected to an amplifying stage formed through the CMOS process. FIG. 4 illustrates a case in which a primary part 71 of an output-sided transformer 70 is connected to a power stage 60 and a winding ratio of a primary part 71 and a secondary part 72 is about 1:2.

In general, after the CMOS process is completed, a metal line is formed on a CMOS IC through the MEMS process which is a subsequent process of the CMOS process. Accordingly, an amplifying stage 60 formed on the CMOS and the transformer 70 formed through the MEMS are connected to each other through via-paths 80 in the MEMS process. Thus, according to the method of FIG. 4, the entire size of the system may be reduced compared with the transformer formed with the IPD, and since the via-paths have a fewer process errors than bonding-wire, it is possible to manufacture a reproducible circuit.

However, in the case of FIG. 4, resistive power loss occurs at the via-paths 80 at which the transformer formed through the MEMS process and the amplifier formed through the CMOS process are connected. In addition, since the MEMS process provides a lower resolution than the CMOS process, a width between two via-paths 80 shown in FIG. 4, that is, a distance between differential signal lines should be wider than that of the transformer formed in the CMOS, and a pad 61 of the CMOS required to form the via-paths should be also widely formed.

Accordingly, as shown in FIG. 4, in the case of the transformer formed through the MEMS process, while the transformer formed in the MEMS and the amplifier formed in the CMOS are connected to each other, a circuit area of the CMOS increases, and power loss occurs due to the via-paths. In addition, there is another problem which is illustrated in FIG. 5.

FIG. 5 illustrates a line portion of the transformer of FIG. 4. Since the MEMS process increases a thickness of the metal line compared to the CMOS process, resistance of the metal line decreases. However, since the resolution by the MEMS process is relatively low compared to that by the CMOS process, a distance (L) between two adjacent metal lines thereof should be relatively wide compared to that of the CMOS. This causes a size of the transformer to increase.

Moreover, in the transformer, the electric power of the primary part is transferred to the secondary part by inductive coupling between two adjacent metal lines, and in this case, if the distance (L) between the two adjacent metal lines is wide, the inductive coupling weakens, thus it is not easy to transfer the electric power from the primary part to the secondary part, thereby deteriorating power conversion efficiency.

Until now, although there has been many reports at a research level about the low ohmic loss which is the advantage of the MEMS technology, the main reason why the MEMS technology is rarely applied to the integrated circuit includes the via-path forming process necessarily required to be actually applied to the CMOS and loss occurring due to the via-path forming process, the additional circuit area required due to the low resolution, and the low inductive coupling.

Resultantly, in the forming of the input-sided and output-sided transformers for the amplifier of the differential structure, when the amplifying stage and the transformer are formed to be integrated together in the CMOS process as shown in FIG. 2, although the size of the entire circuit thereof decreases, the ohmic loss increases due to the thick thickness of the metal line, and the power leak occurs due to an eddy current associated with the lossy substrate.

In addition, as shown in FIG. 3, when the transformer is formed with the IPD, although the IPD process is simple, the power loss and the size of the entire circuit increase due to the asymmetry and the resistance of the bonding wire.

Further, as shown in FIG. 4, when the transformer is formed through the MEMS process, although the entire size of the circuit decreases more than when the transformer is formed with the IPD and the bonding wire is not used unlike the case in which the IPD is used, the processes therefor are complicated, the power leak occurs due to the via-path, and since the metal lines cannot be closely formed due to the low resolution, the inductive coupling weakens, thereby deteriorating the power conversion efficiency.

The background art of the present invention is disclosed in the Korean Patent No. 0743951 (published on Aug. 1, 2007).

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a high frequency transformer for a differential amplifier that may improve power conversion efficiency and output power of an amplifier of a differential structure.

An exemplary embodiment of the present invention provides a high frequency transformer for a differential amplifier, including: a first metal line that is integrated and formed in an IC chip through a CMOS process and that is connected to a differential signal line of a transistor included in the IC chip; and a second metal line that is formed in an MEMS chip through an MEMS process and that is inductively coupled with the first metal line in a state spaced apart from an upper portion of the first metal line, wherein the MEMS chip may be stacked on an upper portion of the IC chip.

Another exemplary embodiment of the present invention provides a high frequency transformer for a differential amplifier, including: a first metal line that is integrated and formed in a first IC chip through a CMOS process and that is connected to a differential signal line of a transistor included in the first IC chip; and a second metal line that is formed in a second IC chip through an IPD process and that is inductively coupled with the first metal line in a state spaced apart from an upper portion of the first metal line, wherein the second IC chip may be stacked on an upper portion of the first IC chip.

The first metal line may be a primary part circuit of the high frequency transformer and is connected to an output-sided differential signal line of the transistor included in a power stage of a driver stage and the power stage provided in the amplifier, and the second metal line may be a secondary part circuit of the high frequency transformer and converts a differential signal applied to the primary part into a single-ended signal.

The second metal line may be a primary part circuit of the high frequency transformer and receives a single-ended signal from the outside, and the first metal line may be a secondary part circuit of the high frequency transformer, is connected to an input-sided differential signal line of the transistor included in a driver stage of the driver stage and a power stage provided in the amplifier, and converts a single-ended signal applied to the primary part into a differential signal.

Widths of the first metal line and the second metal line may be different.

The first metal line and the second metal line may be respectively formed to have the winding number of at least one, and the winding numbers of them are different from each other.

The second metal line may vertically face the first metal line while being not partially coincided with the first metal line in a width direction thereof.

A virtual ground node may be formed on the first metal line, and an external DC voltage may be applied to the virtual ground node.

A distance between the first and second metal lines may be determined by a thickness of an insulation layer formed on a lower portion of the second metal line in the MEMS chip.

A distance between the first and second metal lines may be determined by a thickness of an insulation layer formed on a lower portion of the second metal line in the second IC chip.

According to the high frequency transformer for the differential amplifier of the embodiment of the present invention, when a transformer for an amplifier of a differential structure is formed, a line of a primary part of the transformer is formed to be integrated with an amplifying stage together in a circuit chip formed through the CMOS process, and a line of a secondary part thereof is formed in a circuit chip formed through the MEMS or IPD process, thus power conversion efficiency and output power of the amplifier may be improved without excessive increase of a size of the entire amplifier.

BRIEF DESCRIPTION OF THE DRAWINGS

FIG. 1 is a schematic diagram for explaining an amplifier of a differential structure formed in an integrated circuit.

FIG. 2 is a schematic diagram for explaining a shape of an output-sided transformer shown in FIG. 1.

FIG. 3 is a schematic view for connecting an amplifying stage formed by a CMOS process to a transformer formed by an IPD process.

FIG. 4 illustrates a schematic diagram in which a transformer formed through the MEMS process is connected to an amplifying stage formed through the CMOS process.

FIG. 5 illustrates a line portion of the transformer of FIG. 4.

FIG. 6 illustrates a schematic view in which a high frequency transformer according to a first exemplary embodiment of the present invention is formed in an output portion of a power stage of an amplifier.

FIG. 7 illustrates a schematic view in which a high frequency transformer according to a second exemplary embodiment of the present invention is formed in an input portion of a driver stage of an amplifier.

FIG. 8 illustrates a cross-sectional view of some of the high frequency transformer shown in FIG. 6.

FIG. 9 illustrates exemplary variations of widths of metal lines of primary and secondary parts shown in FIG. 8.

FIG. 10 illustrates a schematic view of a varied winding ratio of the high frequency transformer shown in FIG. 6.

FIG. 11 illustrates a cross-sectional view of some of the high frequency transformer shown in FIG. 10.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

According to a high frequency transformer for a differential amplifier of an exemplary embodiment of the present invention, when a transformer required for an input part and an output part of an amplifier of a differential structure is formed, one of lines of primary and secondary parts of the transformer may be formed to be integrated in a circuit chip through the complementary metal-oxide semiconductor (CMOS) process, and the other thereof may be formed in a circuit chip through the MEMS or IPD process.

As shown in FIG. 1, an amplifier of a differential structure generally includes an input-sided transformer A, a driver stage, a power stage, and an output-sided transformer B, and the transformer according to an exemplary embodiment of the present invention corresponds to the input-sided transformer A and the output-sided transformer B shown in FIG. 1.

Generally, the line of the primary part and the line of the secondary part for forming the high frequency transformer are physically separated from each other, and they are inductively coupled to operate. The primary part and the secondary part of the transformer of the related art are realized by a single process, while the primary part (or the secondary part) of the exemplary embodiment of the present invention is manufactured by the same CMOS process as that for manufacturing the amplifying stage, and the secondary part (or the primary part) thereof is manufactured by the MEMS or IPD process.

As such, according to the exemplary embodiment of the present invention, the manufacturing processes of the line of the primary part and the line of the secondary part are different from each other, thus the problem of the related art in which the entire transformer is manufactured by a single CMOS process, a single MEMS process or a single IPD process may be solved, thereby maximizing the advantages of them.

Hereinafter, a configuration of the high frequency transformer for the differential amplifier according to the exemplary embodiment of the present invention will be described in detail. For better comprehension and ease of description, the MEMS process of the MEMS process and the IPD process will be described as a representative example.

FIG. 6 illustrates a schematic view in which a high frequency transformer according to a first exemplary embodiment of the present invention is formed in an output portion of a power stage of an amplifier.

A high frequency transformer 100 shown in FIG. 6 corresponds to an output-sided transformer that converts a differential signal outputted from a power stage 11 into a single-ended signal to output it. Accordingly, in FIG. 6, a first metal line 110 corresponds to a primary part circuit of the transformer 100, and a second metal line 120 corresponds to a secondary part circuit.

The high frequency transformer 100 according to the first exemplary embodiment of the present invention includes the first metal line 110 and the second metal line 120. The first metal line 110 is formed in an IC chip 10 through the CMOS process, specifically, as shown in FIG. 6, it is integrated to be connected to an output-sided differential signal line of a transistor (a transistor of the power stage 11) included in the IC chip 10. A virtual ground node 111 is formed at a central portion of the first metal line 110 by a differential signal such that an external DC voltage is applied thereto.

The second metal line 120 is formed in an MEMS chip 20 through the MEMS process. Here, the MEMS chip 20 is configured to be stacked on an upper portion of the IC chip 10. Accordingly, the second metal line 120 may be inductively coupled with first metal line 110 in a state in which they are spaced apart from each other. For better comprehension and ease of description in FIG. 6, although two chips 10 and 20 are illustrated to be slightly spaced apart from each other, they are configured to have a stacked structure as shown in FIG. 8.

In the exemplary embodiment of the present invention, the IC chip 10 is an integrated circuit chip manufactured through the CMOS process and specifically, it means a chip in which an amplifier integrated circuit manufactured through the CMOS process is included. In FIG. 6, the first metal line 110 corresponding to the primary part of the high frequency transformer 100 is integrated with amplifier integrated circuit in the IC chip 10 through the CMOS process, while the second metal line 120 corresponding to the secondary part of the high frequency transformer 100 is separated from the primary part and is formed in the MEMS chip 20 through the MEMS process.

The connection of the additional via-paths is required in the structure of FIG. 4 according to the related art which implements the entire transformer through the MEMS process, and the power is leaked and the wide PAD in the CMOS are required due to the via-paths.

However, in the case of the exemplary embodiment of the present invention illustrated in FIG. 6, the primary part and the secondary part of the transformer are separately formed through different processes, and since the primary part and the secondary part of the transformer are basically separated in the DC, the process for separately forming the via-paths is not required unlike the related art.

In the transformer 100 shown in FIG. 6, the first metal line 110 corresponding to the primary part and the second metal line 120 corresponding to the secondary part may be formed to be positioned close enough to each other. This may be easily implemented by simply adjusting a thickness ("t" of FIG. 8) of an insulation layer formed in the lower portion of the second metal line 120 of the MEMS chip 20.

Generally, since a low resolution is provided in the case of the MEMS process, the distance between the adjacent metal lines should be farther than that of the CMOS process. Accordingly, when both the primary part and the secondary part of the transformer are formed in the MEMS process as shown in FIG. 4, the distance between the line of the primary part and the line of the secondary part is widened, thus the power conversion efficiency decreases. However, in the case of the present exemplary embodiment illustrated in FIG. 6, since the lines 110 and 120 of the primary part and the secondary part are formed to be positioned close enough by adjusting only the thickness (t) of the insulation layer corresponding to the distance between two metal lines 110 and 120, the inductive coupling force therebetween may be improved, and the power conversion efficiency of the transformer 100 may be improved.

As described above, according to the exemplary embodiment of the present invention, it is possible to remove the via-paths essential in the transformer formed in the MEMS process, to solve the low resolution due to the MEMS process, and to maximize the advantage of the low resistance characteristic of the metal line according to the MEMS process. Further, considering the case in which the power source voltage of the amplifying stage is supplied through the virtual ground node 111 formed at the central portion of the first metal line 110, since the first metal line 110 itself is formed in the CMOS process, the power source voltage may be more easily applied than that of the related art shown in FIG. 4.

FIG. 6 exemplarily illustrates the example in which the MEMS chip 20 is stacked on the upper portion of the IC chip 10 by the CMOS process, while the IC chip by the IPD process instead of the chip by the MEMS process is stacked on the upper portion of the IC chip 10 in the exemplary embodiment of the present invention.

Since the IPD process is one which manually manufactures the integrated device, the circuit chip manufactured by the IPD process is classified into the integrated circuit chip (IC chip). Accordingly, in this case, the second IC chip 20 by the IPD process may be stacked on the first IC chip 10 by the CMOS process. The first metal line 110 by the CMOS process may be integrated in the first IC chip 10, and the second metal line 120 by the IPD process may be integrated in the second IC chip 20. In addition, when the IPD process is used as described above, the distance between the first and second metal lines 110 and 120 may be adjusted by adjusting the thickness of the insulation layer formed at the lower portion of the second metal line 120 in the second IC chip 20.

FIG. 7 illustrates a schematic view in which a high frequency transformer according to a second exemplary embodiment of the present invention is formed in an input portion of a driver stage of an amplifier.

A high frequency transformer 200 shown in FIG. 7 corresponds to an input-sided transformer that converts a single-ended signal inputted from the outside into a differential signal to apply the converted signal to an input portion of a driver stage 12. Accordingly, in FIG. 7, a second metal line 220 corresponds to a primary part circuit of the transformer 200, and a first metal line 210 corresponds to a secondary part circuit thereof.

The high frequency transformer 200 according to the second exemplary embodiment of the present invention includes the first metal line 210 and the second metal line 220. The first metal line 210 is integrated and formed in the IC chip 10 through the CMOS process, and specifically, it is integrated to be connected to an input-sided differential signal line of a transistor (a transistor of the driver stage 12) included in the IC chip 10 as shown in FIG. 7.

The second metal line 220 is formed in the MEMS chip 20 through the MEMS process and, is inductively coupled to the first metal line 210 in a state spaced apart from the first metal line 210. Accordingly, when the single-ended signal is inputted to the second metal line 220 corresponding to the primary part, the first metal line 210 corresponding to the secondary part serves to convert the single-ended signal into the differential signal again to transfer the again converted signal to the driver stage 12. A DC voltage may be applied to a virtual ground node 211 formed on the first metal line 210.

As shown in FIG. 7, when the transformer according to the exemplary embodiment of the present invention is used at the input part, the primary part of the transformer is formed through the MEMS or IPD process, and the secondary part thereof is formed as a metal line in the CMOS. In FIG. 7, the second metal line 220 may be replaced with one formed through the IPD process.

In FIG. 6 and FIG. 7, the roles of the primary part and the secondary part of the transformer are merely changed to each other. As known in the examples of the output-sided and input-sided transformers shown in FIG. 6 and FIG. 7, their operation principles and formation principles are the same, thus the exemplary embodiment of the present invention will be described based on the output-sided transformer of FIG. 6.

FIG. 8 illustrates a cross-sectional view of some of the high frequency transformer shown in FIG. 6. In FIG. 8, "t" represents the thickness of the insulation layer between the first and second metal lines 110 and 120, the distance between two metal lines 110 and 120 is determined depending on a thickness of "t".

As shown in FIG. 6, FIG. 8 also illustrates a case in which a width w1 of the first metal line 110 and a width w2 of the second metal line 120 are the same. Here, the widths and the vertical dispositions of two metal lines 110 and 120 may be implemented in the same form as shown in FIG. 8, or may be implemented in different forms as shown in FIG. 9.

FIG. 9 illustrates exemplary variations of widths of metal lines of primary and secondary parts shown in FIG. 8. FIG. 9(a) illustrates an example in which the width w2 of the second metal line 120 by the MEMS process is less than the width w1 of the first metal line 110 by the CMOS process (w2<w1), while FIG. 9(b) illustrates an example in which the width w2 of the second metal line 120 by the MEMS process is greater than the width w1 of the first metal line 110 by the CMOS process (w2>w1).

FIG. 9(c) illustrates an example in which the first metal line 110 and the second metal line 120 face each other as described above, but some of the facing surfaces thereof are not overlapped with each other. Specifically, the second metal line 120 is not partially coincided with the first metal line 110 in a width direction of the line to have a region not to face the first metal line 110.

When the first metal line 110 by the CMOS process and the second metal line 120 by the MEMS process are excessively adjacent, a undesired parasitic capacitance may occur, and FIG. 9(c) illustrates a design scheme for suppressing such a parasitic capacitance component.

As shown in FIG. 9(c), since two metal lines 110 and 120 are disposed to have a region of overlapping each other and a region of not overlapping each other, the parasitic capacitance, inductance, and resistance may be freely adjusted. Here, the parasitic capacitance may be adjusted by a size of the overlapped region of the primary part and the secondary part, and the inductance and resistance may be adjusted by a size of the not-overlapped region of the primary part and the secondary part.

In the exemplary embodiment of the present invention, the first metal line 110 and the second metal line 120 may be respectively formed to have the winding number of at least one, and the first and second metal line 110 and 120 may be formed to have the different winding numbers.

FIG. 10 illustrates a schematic view of a varied winding ratio of the high frequency transformer shown in FIG. 6. FIG. 10 illustrates an example in which the winding number of the first metal line 110 by the CMOS process is one and the winding number of the second metal line 120 by the MEMS process is two, thus the winding ratio of them is 1:2.

FIG. 11 illustrates a cross-sectional view of some of the high frequency transformer shown in FIG. 10. FIG. 11(a) illustrates a configuration equivalent to that of FIG. 10, and FIG. 11(b) illustrates a configuration opposite to that of FIG. 10, in which the winding number of the first metal line 110 is two and the winding number of the second metal line 120 is one. Although FIG. 11 illustrates the examples in which the winding ratio of the two metal lines is 1:2 or 2:1, the present exemplary embodiment is not limited thereto, and may be varied to have various winding ratios.

As described above, according to the exemplary embodiments of the present invention, it is possible to solve the problems of the related art for integrating the transformer into the CMOS, the technology using the IPD, and technology using the MEMS and to maximize the advantages of them when the transformer required to the amplifier of the differential structure is formed.

Particularly, according to the exemplary embodiments of the present invention, unlike the related art of manufacturing the entire transformer through the MEMS or IPD process as shown in FIG. 3 and FIG. 4, by manufacturing one of the lines of the primary part and the secondary part of the transformer through the CMOS process and the other thereof through the MEMS or IPD process, the connection of the via-paths or bonding wires is unnecessary, thus the power leak may be solved, the size of the entire amplifier may be reduced, and the power conversion efficiency and the output power may be improved.

As described above, according to the high frequency transformer for the differential amplifier of the embodiment of the present invention, when the transformer for the amplifier of the differential structure is formed, the line of the primary part of the transformer is formed to be integrated with the amplifying stage together in the circuit chip formed through the CMOS process, and the line of the secondary part thereof is formed in the circuit chip formed through the MEMS or IPD process, thus the power conversion efficiency and the output power of the amplifier may be improved without excessive increase of the size of the entire amplifier.

While the present invention has been described in connection with what is presently considered to be practical exemplary embodiments, it is to be understood that the present invention is not limited to the disclosed embodiments, but, on the contrary, is intended to cover various modifications and equivalent arrangements included within the spirit and scoop of the appended claims. Accordingly, the scoop of the present invention shall be determined only according to the attached claims.

What is claimed is:
1. A high frequency transformer for a differential amplifier, comprising:
a first metal line that is integrated and formed in an IC chip through a CMOS process and that is connected to a differential signal line of a transistor included in the IC chip; and
a second metal line that is formed in an MEMS chip through an MEMS process and that is inductively coupled with the first metal line in a state spaced apart from an upper portion of the first metal line, wherein the MEMS chip is stacked on an upper portion of the IC chip, wherein the second metal line is a primary part circuit of the high frequency transformer and receives a single-ended signal from an outside, and wherein the first metal line is a secondary part circuit of the high frequency transformer, is connected to an input-sided differential signal line of the transistor included in a driver stage of the driver stage and a power stage provided in the amplifier, and converts the single-ended signal applied to the primary part circuit into a differential signal.

2. The high frequency transformer for the differential amplifier of claim 1, wherein
widths of the first metal line and the second metal line are different.

3. The high frequency transformer for the differential amplifier of claim 1, wherein
the first metal line and the second metal line are respectively formed to have the winding number of at least one, and the winding numbers of them are different from each other.

4. The high frequency transformer for the differential amplifier of claim 1, wherein
the second metal line vertically faces the first metal line while being not partially coincided with the first metal line in a width direction thereof.

5. The high frequency transformer for the differential amplifier of claim 1, wherein
a virtual ground node is formed on the first metal line, and an external DC voltage is applied to the virtual ground node.

6. The high frequency transformer for the differential amplifier of claim 1, wherein
a distance between the first and second metal lines is determined by a thickness of an insulation layer formed on a lower portion of the second metal line in the MEMS chip.

7. A high frequency transformer for a differential amplifier, comprising:
a first metal line that is integrated and formed in a first IC chip through a CMOS process and that is connected to a differential signal line of a transistor included in the first IC chip; and a second metal line that is formed in a second IC chip through an IPD process and that is inductively coupled with the first metal line in a state spaced apart from an upper portion of the first metal line, wherein the second IC chip is stacked on an upper portion of the first IC chip, wherein the second metal line is a primary part circuit of the high frequency transformer and receives a single-ended signal from an outside, and wherein the first metal line is a secondary part circuit of the high frequency transformer, is connected to an input-sided differential signal line of the transistor included in a driver stage of the driver stage and a power stage provided in the amplifier, and converts the single-ended signal applied to the primary part circuit into a differential signal.

8. The high frequency transformer for the differential amplifier of claim 7, wherein
widths of the first metal line and the second metal line are different.

9. The high frequency transformer for the differential amplifier of claim 7, wherein
the first metal line and the second metal line are respectively formed to have the winding number of at least one, and the winding numbers of them are different from each other.

10. The high frequency transformer for the differential amplifier of claim 7, wherein
the second metal line vertically faces the first metal line while being not partially coincided with the first metal line in a width direction thereof.

11. The high frequency transformer for the differential amplifier of claim 7, wherein
a virtual ground node is formed on the first metal line, and an external DC voltage is applied to the virtual ground node.

12. The high frequency transformer for the differential amplifier of claim 7, wherein
a distance between the first and second metal lines is determined by a thickness of an insulation layer formed on a lower portion of the second metal line in the second IC chip.

* * * * *